(12) United States Patent
Strzalkowski

(10) Patent No.: US 11,736,072 B2
(45) Date of Patent: Aug. 22, 2023

(54) POWER AMPLIFIER FAULT DETECTOR

(71) Applicant: Analog Devices International Unlimited Company, Limerick (IE)

(72) Inventor: Bernhard Strzalkowski, Munich (DE)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 226 days.

(21) Appl. No.: 17/316,661

(22) Filed: May 10, 2021

(65) Prior Publication Data

US 2021/0265956 A1  Aug. 26, 2021

Related U.S. Application Data

(63) Continuation of application No. 16/374,219, filed on Apr. 3, 2019, now Pat. No. 11,005,431.

(51) Int. Cl.
| | |
|---|---|
| *H03F 1/07* | (2006.01) |
| *H03F 1/52* | (2006.01) |
| *H03F 3/21* | (2006.01) |
| *G01R 31/40* | (2020.01) |
| *H04B 1/04* | (2006.01) |

(52) U.S. Cl.
CPC ............. *H03F 1/52* (2013.01); *G01R 31/40* (2013.01); *H03F 3/211* (2013.01); *H04B 1/0466* (2013.01); *H03F 2200/426* (2013.01); *H03F 2200/451* (2013.01); *H03F 2200/462* (2013.01); *H04B 2001/0408* (2013.01)

(58) Field of Classification Search
CPC ........................................................ H03F 1/07
USPC ............................................... 330/124 R, 295
See application file for complete search history.

(56) References Cited

U.S. PATENT DOCUMENTS

| | | | |
|---|---|---|---|
| 8,077,486 B2 | 12/2011 | Djenguerian et al. | |
| 2014/0028394 A1* | 1/2014 | Chen ........................ | H03F 1/34 330/257 |
| 2014/0071570 A1 | 3/2014 | Moffett et al. | |
| 2014/0097905 A1* | 4/2014 | Xu ............................ | H03F 3/19 330/296 |
| 2014/0340151 A1* | 11/2014 | van Sinderen .......... | H03F 1/342 330/260 |

FOREIGN PATENT DOCUMENTS

CN  103248237 A  8/2013

\* cited by examiner

*Primary Examiner* — Henry Choe
(74) *Attorney, Agent, or Firm* — ArentFox Schiff LLP

(57) ABSTRACT

Herein disclosed in some embodiments is a fault detector for power amplifiers of a communication system. The fault detector can detect a portion of the power amplifiers that are in fault condition and can prevent or limit current flow to the power amplifiers in fault condition while allowing the rest of the power amplifiers to operate normally. The fault detector can further indicate which power amplifiers are in fault condition and/or the cause for the power amplifiers to be in fault condition. Based on the indication, a controller can direct communications away from the power amplifiers in fault condition and/or perform operations to correct the fault condition.

10 Claims, 8 Drawing Sheets

POWER AMPLIFIER FAULT DETECTOR

PRIORITY DATA

This application is a continuation, and claims the benefit of priority under 35 U.S.C. 120, of U.S. non-provisional patent application Ser. No. 16/374,219, filed Apr. 3, 2019, entitled, "POWER AMPLIFIER FAULT DETECTOR." The earlier non-provisional patent application is incorporated herein by reference in its entirety.

FIELD OF THE DISCLOSURE

This disclosure relates in general to the field of communications, and more particularly, though not exclusively, to a system and method for detecting and indicating power amplifier faults within a communication system.

BACKGROUND

Many legacy communication entities produce a signal at a lower magnitude and rely on power amplifiers to increase the magnitude of the signal for transmission of the signal. In many instances, the legacy communication entities may include multiple power amplifiers, where each of the power amplifiers may be utilized for increasing the magnitude of the signal for transmission via corresponding transmission means. When one or more of the power amplifiers enter a fault condition, the legacy communication entities fail to identify which of the power amplifiers have entered the fault condition. The inability to identify which of the power amplifiers are in the fault condition can result in shut down of the entire legacy communication entity for identification and repair of the fault condition.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY OF THE DISCLOSURE

Figure 1:
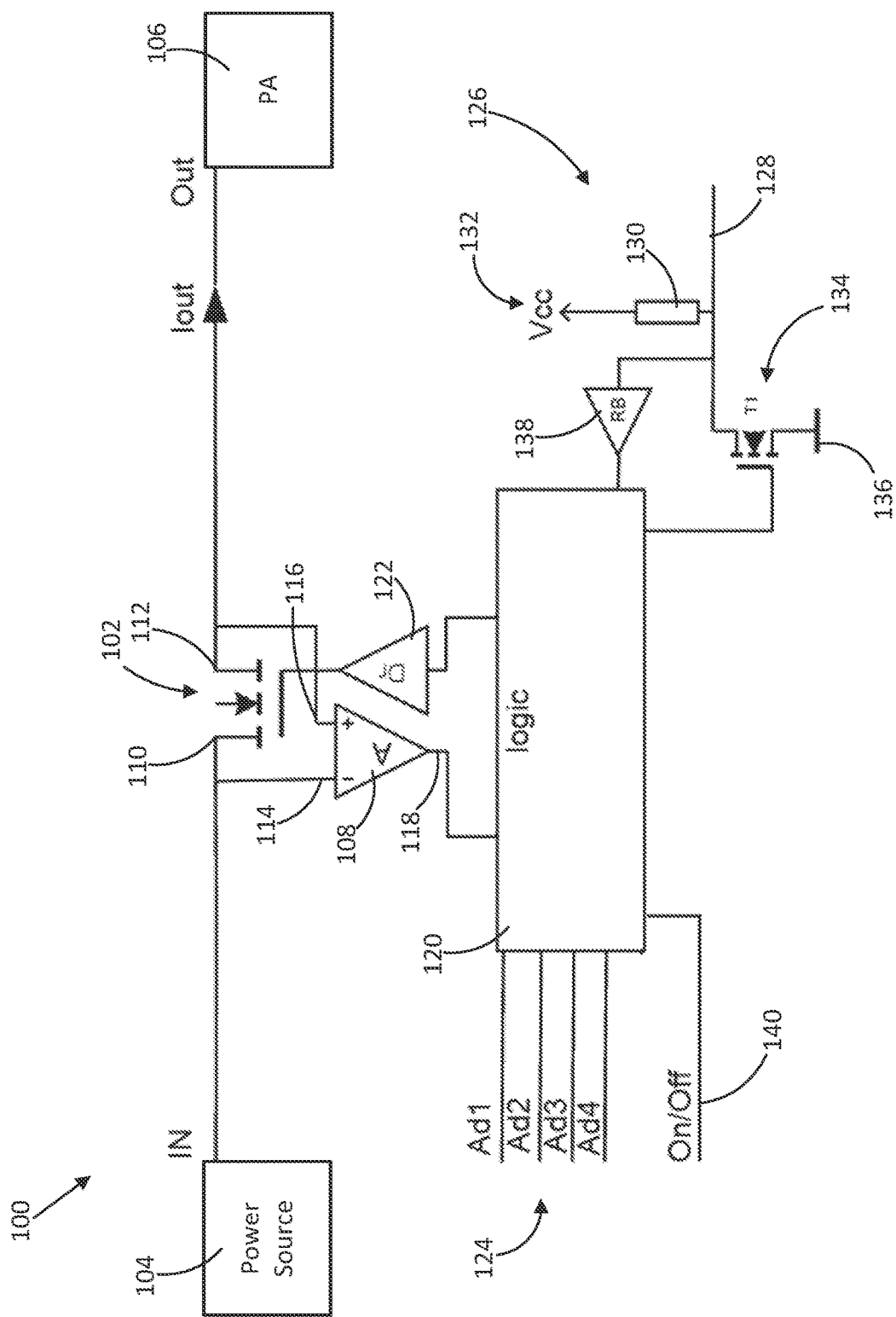
FIG. 1 illustrates example fault detection circuitry, according to various embodiments of the disclosure.

Herein disclosed in some embodiments is a fault detector for power amplifiers of a communication system. The fault detector can detect a portion of the power amplifiers that are in fault condition and can prevent or limit current flow to the power amplifiers in fault condition while allowing the rest of the power amplifiers to operate normally. The fault detector can further indicate which power amplifiers are in fault condition and/or the cause for the power amplifiers to be in fault condition. Based on the indication, a controller can direct communications away from the power amplifiers in fault condition and/or perform operations to correct the fault condition.

In certain embodiments, a fault detector to detect faults of one or more power amplifiers is provided that discloses an electronic limiter coupled to at least one power amplifier of the one or more power amplifiers and to a power source of the at least one power amplifier, and logic coupled to the electronic limiter. The logic is configured to determine an amount of current flow across the electronic limiter, and control operation of the electronic limiter based on the determined amount of current flow.

In certain embodiments, a method for detecting faults of one or more power amplifiers is provided that discloses determining, by logic, an amount of current flow across a current limiter coupled to a portion of the one or more power amplifiers and a power source for the portion of the one or more power amplifiers, determining, by the logic, whether the determined amount of current flow exceeds a current threshold, and controlling, by the logic, activation of the current limiter based on the determination whether the determined amount of current flow exceeds the current threshold.

In certain embodiments, a communication system is provided that discloses an antenna array, signal generating circuitry to generate communications for transmission via the antenna array, and power amplifying circuitry coupled between the antenna array and the signal generating circuitry. The power amplifying circuitry includes one or more power amplifiers configured to receive the communications from the signal generating circuitry and amplify the communications for transmission via the antenna array, and fault detection circuitry coupled to the one or more power amplifiers. The fault detection circuitry is configured to determine whether any of the one or more power amplifiers is in fault condition, and prevent or limit current flow from a power source to any of the one or more power amplifiers determined to be in the fault condition.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

Many communication systems perform processing and generation of communications at a first power level and amplify the communications to a higher power level for transmission of the communications. For example, in 5G mobile communication systems, power amplifiers may be utilized to amplify communications generated by the system prior to wireless transmission of the communication via antennas.

As systems have advanced, multiple-input, multiple-output approaches to provide greater throughput through the system. These systems that utilize multiple-input, multiple-output approaches often will have multiple power amplifiers to support the multiple outputs (such as multiple antennas). When one or more of the power amplifiers fail, communications directed to the power amplifiers in a fault condition may not be transmitted causing improper operation of the system. Accordingly, it is beneficial to identify which power amplifiers are in a fault condition and direct communications away from the power amplifiers in a fault condition. Described further herein are some systems that may identify which power amplifiers are in a fault condition and may provide information regarding which power amplifiers are in a fault condition to facilitate remedial measures to address the power amplifiers in a fault condition.

FIG. 1 illustrates example fault detection circuitry 100, according to various embodiments of the disclosure. The fault detection circuitry 100 may be coupled to one or more power amplifiers (PAs) and may control provision of power to the PAs. Further, the fault detection circuitry 100 may detect if any of the PAs is in a fault condition and indicate which of the PAs are in fault condition to other circuitry, such as a controller coupled to the PAs.

The fault detection circuitry 100 may include an electronic limiter 102. The electronic limiter 102 may comprise a transistor, such as the MOSFET illustrated. Further, the electronic limiter 102 may operate as an electronic circuit breaker in some embodiments. The electronic limiter 102 may be coupled between a power source 104 and a PA 106. In particular, an input 110 of the electronic limiter 102 may be coupled to the power source 104 and an output 112 of the electronic limiter 102 may be coupled to the PA 106. When activated, the electronic limiter 102 may allow current to pass from the power source 104 to the PA 106, thereby providing power to the PA 106. When deactivated, the electronic limiter 102 may prevent flow of current from the power source 104 to the PA 106, thereby preventing power from being provided to the PA 106. In some embodiments, the electronic limiter 102 may further limit current flow to below a maximum current in some instances, thereby limiting an amount of power being provided to the PA 106. In other embodiments, the electronic limiter 102 may be coupled to more than one PA, where activation and deactivation of the electronic limiter 102 allows or prevents current from flowing to the more than one PA, respectively.

The fault detection circuitry 100 may further include an operational amplifier 108. Inputs of the operational amplifier 108 may be coupled to the input 110 and the output 112 of the electronic limiter 102, respectively. In particular, a first input 114 of the operational amplifier 108 may be coupled to the input 110 of the electronic limiter 102, and a second input 116 of the operational amplifier 108 may be coupled to the output 112 of the electronic limiter 102. The operational amplifier 108 may compare the voltages received on the first input 114 and the second input 116, and determine a difference between the voltages. The operational amplifier 108 may output the difference between the voltages on an output 118 of the operational amplifier 108.

The fault detection circuitry 100 may further include logic 120. The logic 120 may comprise an integrated circuit, such as a processor. The logic 120 may be coupled to the output 118 of the operational amplifier 108 and receive the difference between the voltages on the output 118. Based on the difference between the voltages, the logic 120 may determine an amount of current flowing across the electronic limiter 102. The logic 120 may compare the determined amount of current to a current threshold. For example, the logic 120 may compare a magnitude of the determined amount of current to the current threshold to determine whether the magnitude of the determined amount of current exceeds the current threshold. The current threshold may be selected to be a maximum current draw of the PA 106 during normal operation of the PA 106. If the logic 120 determines that the amount of current flowing across the electronic limiter 102 is less than the current threshold, the logic 120 may determine that the PA 106 is operating in a normal state. If the logic 120 determines that the amount of current flowing across the electronic limiter 102 is greater than the current threshold, the logic 120 may determine that the PA 106 is in a fault condition.

The fault detection circuitry 100 may further include a driver 122. The driver 122 may be coupled between the logic 120 and the electronic limiter 102. For example, the driver 122 is coupled between the logic 120 and a gate of the MOSFET in the illustrated embodiment. The driver 122 may define whether the electronic limiter 102 is activated, deactivated, or limiting an amount of current flowing through the electronic limiter 102. For example, the electronic limiter 102 may be activated when the voltage output by the driver 122 to the electronic limiter 102 is at a first voltage level, may be deactivated when the voltage output by the driver 122 is at a second voltage level, and may limit an amount of current flow at a third voltage level.

The logic 120 may control the output of the driver 122. In particular, an output of the logic 120 may control whether the driver 122 outputs the first voltage level, the second voltage level, or the third voltage level. Accordingly, the logic 120 may control whether the electronic limiter 102 is activated, deactivated, or limiting the current flow by controlling the output of the driver 122. The logic 120 may determine whether to have the electronic limiter 102 activated, deactivated, or limiting current flow based on the comparison between the current flow across the electronic limiter 102 and the current threshold. In particular, the logic 120 may determine that the PA 106 is in a fault condition based on the comparison and may cause the electronic limiter 102 to be deactivated based on the PA 106 being in the fault condition. The logic 120 may maintain the electronic limiter 102 in the deactivated state until the fault condition is cleared, which may be indicated by an operator in some embodiments. When the logic 120 determines that the PA 106 is not in a fault condition based on the current flow across the electronic limiter 102 being less than the current threshold, the logic 120 may maintain the electronic limiter 102 in the activated state.

For brevity, one of each of the electronic limiter 102, the PA 106, the operational amplifier 108, and the driver 122 are illustrated. It is to be understood that in other embodiments, there may be multiple electronic limiters, PAs, operational amplifiers, and/or drivers, which each include a similar arrangement to the electronic limiter 102, the PA 106, the operational amplifier 108, and the driver 122. In particular, each electronic limiter may be coupled between the power source 104 and a corresponding PA, where the logic 120 may utilize an operational amplifier and driver corresponding to the electronic limiter to determine whether the PA is in a fault condition and control activation of the electronic limiter.

The fault detection circuitry 100 may include one or more address lines 124 coupled to the logic 120. For example, the address lines 124 include Ad1, Ad2, Ad3, and Ad4 in the illustrated embodiment. The address lines 124 may provide addresses to the logic 120 that can be utilized for assigning an address to PAs. For example, the logic 120 may assign an address from the address lines 124 to the PA 106, or to a group of PAs coupled to the electronic limiter 102 when the electronic limiter 102 is coupled to multiple PAs. In embodiments, where the fault detection circuitry 100 includes multiple PAs, the address lines 124 may be utilized for assigning addresses to each of the corresponding PAs. In the illustrated embodiment, each address may comprise a high or low value placed on each of the address lines 124, where the combination of values can supply addresses for 2^4, or 16, PAs. The logic 120 may receive the addresses on the address lines and assign the addresses to corresponding PAs associated with the logic 120.

The fault detection circuitry 100 may further include fault line bus circuitry 126. The fault line bus circuitry 126 may be coupled to the logic 120 and may be utilized by the logic 120 to provide information regarding any PA fault conditions on a fault line 128. The fault line 128 may be a single wire fault line in some embodiments. In other embodiments, the fault line 128 may include more than one wire and/or may implement certain communication standards such as serial peripheral interface (SPI). The fault line 128 may be coupled to a controller that controls the signals provided to the PAs, such as the PA 106.

The fault line bus circuitry 126 may include an impedance element 130 coupled between a voltage rail 132 of the fault detection circuitry 100 and the fault line 128. The fault line bus circuitry 126 may further include a transistor 134 coupled between a ground 136 of the fault detection circuitry 100 and the fault line 128. The logic 120 may be coupled to the transistor 134 and may control activation of the transistor 134 (i.e., whether current is allowed to flow across the transistor 134). When the logic 120 activates the transistor 134, the fault line 128 may be pulled to ground causing the fault line 128 to present a low logic state. When the logic 120 deactivates the transistor 134, the fault line 128 may be pulled to the voltage rail causing the fault line 128 to present a high logic state. The fault line bus circuitry 126 may be configured as open drain to ensure OR logic-function. The logic 120 may cause the transistor 134 to transition between activation and deactivation to cause certain information to be placed on the fault line 128, as described further in relation to FIG. 2.

The fault line bus circuitry 126 may further include a read back device 138. In some embodiments, the read back device 138 may comprise a comparator. The read back device 138 may be coupled between the fault line 128 and the logic 120. The read back device 138 may provide the value of the fault line 128 back to the logic 120. The logic 120 may determine whether the value of the fault line 128 is equal to the value the logic 120 intended the value of the fault line 128 to be at the time. Based on the comparison of the value and the intended value, the logic 120 may determine whether the value on the fault line 128 is an error and indicate the error to the controller.

The fault detection circuitry 100 may further include an on/off line 140 coupled to the logic 120. The on/off line 140 may provide values to the logic 120 that causes the logic 120 to turn the electronic limiter 102 on or off.

Figure 2:
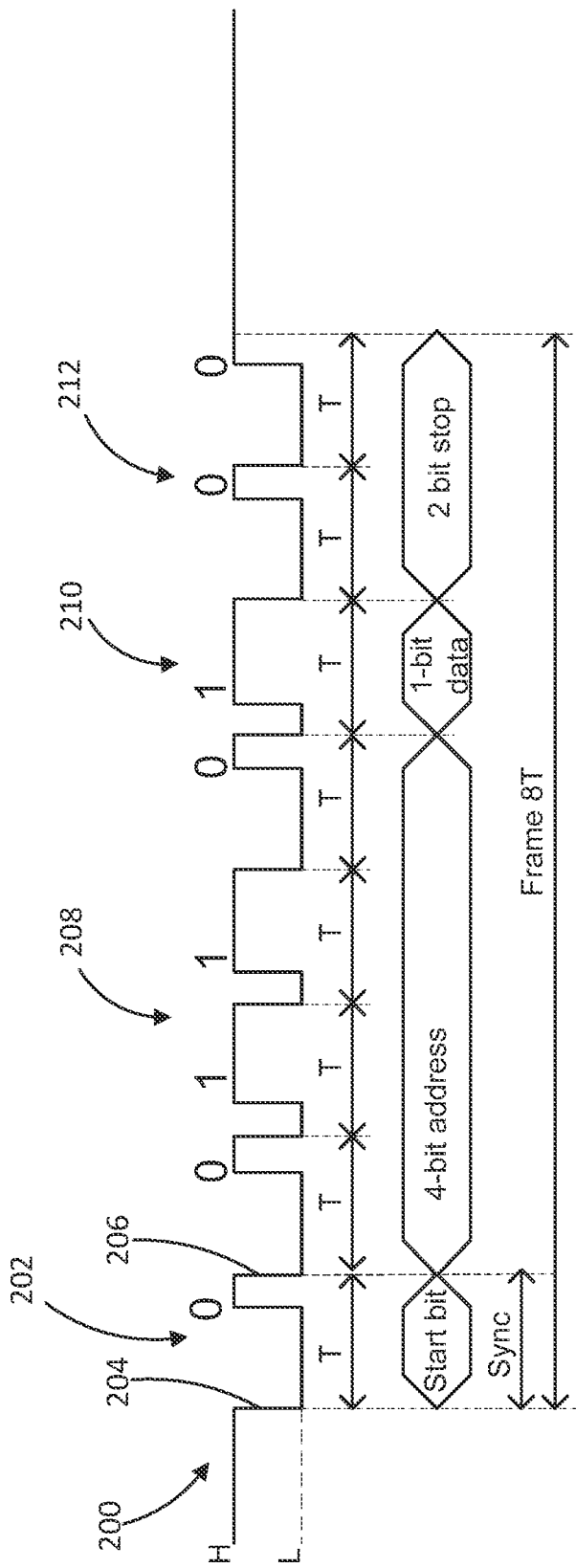
FIG. 2 illustrates an example fault indicator signal, according to various embodiments of the disclosure.

FIG. 2 illustrates an example fault indicator signal 200, according to various embodiments of the disclosure. The fault indicator signal 200 may be propagated on the fault line 128 (FIG. 1) by the logic 120 (FIG. 1). In particular, the fault indicator signal 200 illustrates a portion of a signal propagated on the fault line 128 when a fault condition has been detected by the logic 120. The logic 120 may maintain the value of the fault line 128 at a logic level high when a fault condition has not been detected by the logic 120. The fault indicator signal 200 is to be understood as an example of a configuration for signals propagated on the fault line 128 indicating a fault condition and is not to be interpreted to limiting the embodiment to the exact values (i.e., logic level high or logic level low) depicted by the fault indicator signal 200.

In the illustrated embodiment, the indication of the fault condition in the fault indicator signal 200 may comprise eight frames, where each frame is equal to a predetermined time. The predetermined time may be dependent on the system. Each frame of the indication of the fault condition may initiate with a transition to a logic level low of the frame. In other embodiments, the fault condition may be indicated by more or fewer frames depending on the number of bits in addresses assigned to PAs (such as the addresses being assigned by the logic 120 to the PAs described in FIG. 1), the number of bits of data related to the fault condition to be included in the indication, and/or the number of stop bits to be included in the indication.

The indication of the fault condition may initiate with a start bit 202 in the fault indicator signal 200. The start bit 202 may comprise a portion of the fault indicator signal 200 that is to be determined by the controller to have a bit value of 0 based on the value of the fault indicator signal 200 being maintained at a logic level low for at least 75% of a frame. The start bit 202 may occur after the fault indicator signal 200 has been maintained at a logic level high for at least a predetermined time period, which can be programmed. The start bit 202 may initiate with the fault indicator signal 200 being pulled to a logic level low at a beginning of the frame corresponding to the start bit 202 and transitioning to a logic level high after at least 75% of the frame has passed. The fault indicator signal 200 may again be pulled to a logic level low at the end of the frame corresponding to the start bit 202.

A first falling edge 204 of the start bit 202 that occurs when the fault indicator signal 200 is pulled to a logic level low at the beginning of the frame may indicate that the indication of the fault condition is beginning to the controller. In some embodiments, the first falling edge 204 may cause an interrupt of the controller. Further, the first falling edge 204 may cause other bus members to be disabled for the duration of the indication of the fault condition. Further, the first falling edge 204 and a second falling edge 206, that occurs when the fault indicator signal 200 is pulled to a logic level low at the end of the frame, may be utilized by the controller to synchronize with the frames of the fault indicator signal 200.

Following the start bit 202, the fault indicator signal 200 may include an address indication 208. The address indication 208 may have a duration of four frames, and may indicate an address of the PA that was detected to be in a fault condition. Each frame of the address indication 208 may indicate a bit of the address of the PA. For example, the frames of the address indication 208 translate to the address of "0110" in the illustrated embodiment. The fault indicator signal 200 may be maintained in a logic level low for at least 75% of a frame to indicate that the frame should be interpreted as a 0 bit, and may be maintained in a logic level low for at most 25% of the frame to indicate that the frame should be interpreted as a 1 bit. In other embodiments, the percentage of the times that the fault indicator signal 200 is maintained in a logic level low to indicate the value of the bit may vary, where the percentage to be interpreted as a 0 bit may be greater than 50% and the percentage to be interpreted as a 1 bit may be less than 50%. In other embodiments, the address indication 208 may have a duration of more than or fewer than four frames, where the number of frames may be equal to the number of bits in each address of the PAs.

Following the address indication 208, the fault indicator signal 200 may include a data bit 210. The data bit 210 may indicate a reason for the fault condition. In some embodiments, the data bit 210 may indicate whether the fault condition is due to over-current or over-temperature. Based on the address indication 208 and/or the data bit 210, the controller that receives the fault indicator signal 200 may determine how to address the fault condition. For example, the controller may direct communications intended for transmission via the PA in the fault condition to other PAs that are not in fault condition in some embodiments. In instances where the data bit 210 indicates that the reason for the fault condition is over-temperature, the controller may direct communications away from the PA in the fault condition for a period of time to allow the PA to cool. In some embodiments, the controller may further take corrective actions to address the fault condition where the fault condition may be corrected.

The indication of the fault condition may end with stop bits 212 in the fault indicator signal 200. The stop bits 212 may indicate to the controller that the indication of the fault condition has completed. In the illustrated embodiment, the stop bits 212 may comprise two frames. The values represented by the frames corresponding to the stop bits 212 may be set to a predetermined value to indicate the completion of the indication of the fault condition.

Figure 3:
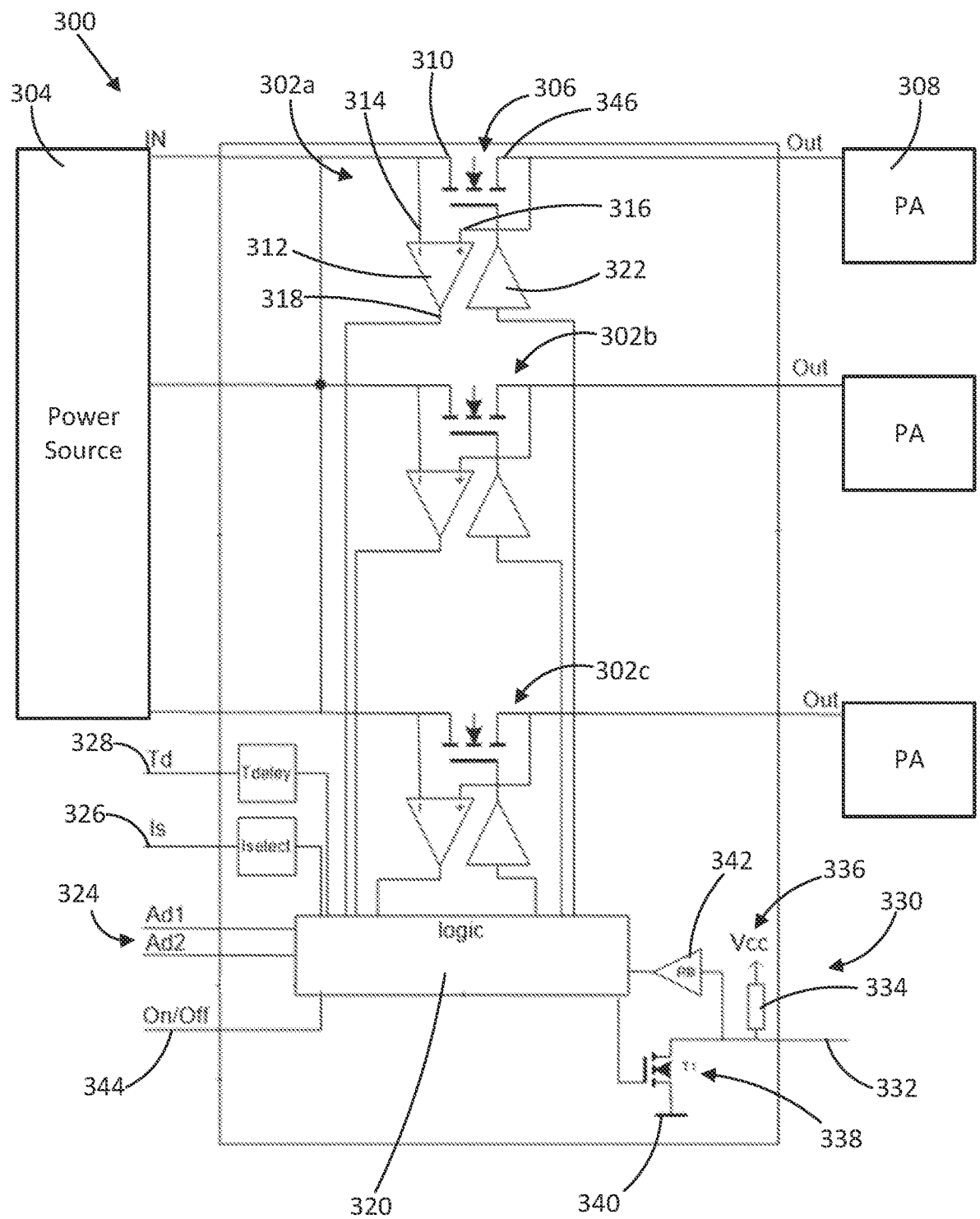
FIG. 3 illustrates another example fault detection circuitry, according to various embodiments of the disclosure.

FIG. 3 illustrates another example fault detection circuitry 300, according to various embodiments of the disclosure. The fault detection circuitry 300 may include one or more of the features of the fault detection circuitry 100 (FIG. 1). The fault detection circuitry 300 may be coupled to one or more PAs and may control provision of power to the PAs. For example, the fault detection circuitry 300 is coupled to three PAs in the illustrated embodiment. In other embodiments, the fault detection circuitry 300 may be coupled to more or fewer PAs. Further, the fault detection circuitry 300 may detect if any of the PAs are in a fault condition and indicate which of the PAs are in fault condition to other circuitry, such as a controller coupled to the PAs.

The fault detection circuitry 300 may include three electronic limiter circuitries: first electronic limiter circuitry 302a, second electronic limiter circuitry 302b, and third electronic limiter circuitry 302c. Each of the electronic limiter circuitries may be coupled between power source 304 and corresponding PAs. For brevity, the first electronic limiter circuitry 302a is described. It should be understood that the second electronic limiter circuitry 302b and the third electronic limiter circuitry 302c may include the same features as the first electronic limiter circuitry 302a.

The first electronic limiter circuitry 302a may include an electronic limiter 306. The electronic limiter 306 may comprise a transistor, such as the MOSFET illustrated. The electronic limiter 306 may be coupled between the power source 304 and a PA 308. In particular, an input 310 of the electronic limiter 306 may be coupled to the power source 304 and an output 346 of the electronic limiter 306 may be coupled to the PA 308. When activated, the electronic limiter 306 may allow current to pass from the power source 304 to the PA 308, thereby providing power to the PA 308. When deactivated, the electronic limiter 306 may prevent flow of current from the power source 304 to the PA 308, thereby preventing power from being provided to the PA 308. In some embodiments, the electronic limiter 306 may limit the amount of current flow from the power source 304 to the PA 308 in some instances. In other embodiments, the electronic limiter 306 may be coupled to more than one PA, where activation and deactivation of the electronic limiter 306 allows or prevents current from flowing to the more than one PA, respectively.

The first electronic limiter circuitry 302a may further include an operational amplifier 312. Inputs of the operational amplifier 312 may be coupled to the input 310 and the output 346 of the electronic limiter 306, respectively. In particular, a first input 314 of the operational amplifier 312 may be coupled to the input 310 of the electronic limiter 306, and a second input 316 of the operational amplifier 312 may be coupled to the output 346 of the electronic limiter 306. The operational amplifier 312 may compare the voltages received on the first input 314 and the second input 316, and determine a difference between the voltages. The operational amplifier 312 may output the difference between the voltages on an output 318 of the operational amplifier 312.

The fault detection circuitry 300 may include logic 320. The logic 320 may comprise an integrated circuit, such as a processor. The logic 320 may be coupled to the output 318 of the operational amplifier 312 and receive the difference between the voltages on the output 318. Based on the difference between the voltages, the logic 320 may determine an amount of current flowing across the electronic limiter 306. The logic 320 may compare the determined amount of current to a current threshold. For example, the logic 320 may compare a magnitude of the determined amount of current to the current threshold to determine whether the magnitude of the determined amount of current exceeds the current threshold. The current threshold may be selected to be a maximum current draw of the PA 308 during normal operation of the PA 308. If the logic 320 determines that the amount of current flowing across the electronic limiter 306 is less than the current threshold, the logic 320 may determine that the PA 308 is operating in a normal state. If the logic 320 determines that the amount of current flowing across the electronic limiter 306 is equal to or greater than the current threshold, the logic 320 may determine that the PA 308 is in a fault condition.

The first electronic limiter circuitry 302a may further include a driver 322. The driver 322 may be coupled between the logic 320 and the electronic limiter 306. For example, the driver 322 is coupled between the logic 320 and a gate of the MOSFET in the illustrated embodiment. The driver 322 may define whether the electronic limiter 306 is activated or deactivated. For example, the electronic limiter 306 may be activated when the voltage output by the driver 322 to the electronic limiter 306 is at a first voltage level, may be deactivated when the voltage output by the driver 322 is at a second voltage level, and may limit current flow at a third voltage level.

The logic 320 may control the output of the driver 322. In particular, an output of the logic 320 may control whether the driver 322 outputs the first voltage level, the second voltage level, or the third voltage level. Accordingly, the logic 320 may control whether the electronic limiter 306 is activated, deactivated, or limits an amount of current flow by controlling the output of the driver 322. The logic 320 may determine whether to have the electronic limiter 306 activated, deactivated, or limiting current flow based on the comparison between the current flow across the electronic limiter 306 and the current threshold. In particular, the logic 320 may determine that the PA 308 is in a fault condition based on the comparison and may cause the electronic limiter 306 to be deactivated or limit an amount of current flow based on the PA 308 being in the fault condition. The logic 320 may maintain the electronic limiter 306 in the deactivated state or continue to limit the amount of current flow until the fault condition is cleared, which may be indicated by an operator in some embodiments. When the logic 320 determines that the PA 308 is not in a fault condition based on the current flow across the electronic limiter 306 being less than the current threshold, the logic 320 may maintain the electronic limiter 306 in the activated state.

The fault detection circuitry 300 may include one or more address lines 324 coupled to the logic 320. For example, the address lines 324 include Ad1 and Ad2 in the illustrated embodiment. The address lines 324 may provide addresses to the logic 320 that can be utilized for assigning an address to the PAs, such as the PA 308. In embodiments, where the fault detection circuitry 300 is coupled to multiple PAs, the address lines 324 may be utilized for assigning addresses to each of the corresponding PAs. Multiple different voltage levels may be applied to the address lines 324 to indicate an address to be assigned to one of the PAs. For example, the logic 320 may distinguish between four different threshold levels on each of the address lines 324 to determine numbers for an address to be assigned to the PAs. In some examples, a first threshold level (such as 0 volts) may translate to a bit value of 00, a second threshold level (such as 1.7 volts) may translate to a bit value of 01, a third threshold level (such as 3.4 volts) may translate to a bit value of 10, and a fourth threshold level (such as 5 volts) may translate to a bit value of 11. One of the address lines 324 (such as Ad1) may provide the two least significant bits of the address to be assigned, while the other of the address lines 324 (such as Ad2) may provide the two most significant bits of the address. Accordingly, the address lines 324 may provide a four bit address in the illustrated example, which may provide for 16 addresses to be generated.

The fault detection circuitry 300 may further include a trip/limit value line 326 coupled to the logic 320. The trip/limit value line 326 may be utilized to set a trip current for one or more of the electronic limiters (such as the electronic limiter 306) within the fault detection circuitry 300 and/or a limit current (i.e., a maximum current value that can be passed through an electronic limiter) for one or more of the electronic limiters within the fault detection circuitry 300. The logic 320 may detect a value on the trip value line 326 and determine a current threshold at which one or more of the PAs is to be determined to be in a fault condition. The current threshold determined from the trip value line 326 may be applied to all the PAs coupled to the fault detection circuitry 300, or may correspond with an address provided on the address lines 324 to have the current threshold applied to a certain one or group of PAs to which the address is assigned. In some embodiments, the trip value line 326 may be omitted.

The fault detection circuitry 300 may further include a trip/limit time delay line 328 coupled to the logic 320. The trip/limit time delay line 328 may be utilized to set a delay time from when a PA is determined to be in a fault condition to when the corresponding electronic limiter is transitioned to a deactivated state and/or the electronic limiter begins to limit current flow. The logic 320 may detect a value on the trip/limit time delay line 328 and determine a time delay from the determination of the fault condition to a time when the logic 320 deactivates the corresponding electronic limiter. The time delay determined from the trip/limit time delay line 328 may be applied to all the PAs coupled to the fault detection circuitry 300, or may correspond with an address provided on the address lines 324 to have the time delay applied to a certain one or group of PAs to which the address is assigned. In some embodiments, the trip/limit time delay line 328 may be omitted.

The fault detection circuitry 300 may further include fault line bus circuitry 330. The fault line bus circuitry 330 may be coupled to the logic 320 and may be utilized by the logic 320 to provide information regarding any PA fault conditions on a fault line 332. The fault line 332 may be a single wire fault line in some embodiments. In other embodiments, the fault line 332 may include more than one wire and/or may implement certain communication standards such as SPI. The fault line 332 may be coupled to a controller that controls the signals provided to the PAs, such as the PA 308.

The fault line bus circuitry 330 may include an impedance element 334 coupled between a voltage rail 336 of the fault detection circuitry 300 and the fault line 332. The fault line bus circuitry 330 may further include a transistor 338 coupled between a ground 340 of the fault detection circuitry 300 and the fault line 332. The logic 320 may be coupled to the transistor 338 and may control activation of the transistor 338 (i.e., whether current is allowed to flow across the transistor 338). When the logic 320 activates the transistor 338, the fault line 332 may be pulled to ground causing the fault line 332 to present a low logic state. When the logic 320 deactivates the transistor 338, the fault line 332 may be pulled to the voltage rail causing the fault line 332 to present a high logic state. The fault line bus circuitry 330 may be configured as open drain to ensure OR logic-function. The logic 320 may cause the transistor 338 to transition between activation and deactivation to cause certain information to be placed on the fault line 332, as described further in relation to FIG. 2.

The fault line bus circuitry 330 may further include a read back device 342. In some embodiments, the read back device 342 may comprise a comparator. The read back device 342 may be coupled between the fault line 332 and the logic 320. The read back device 342 may provide the value of the fault line 332 back to the logic 320. The logic 320 may determine whether the value of the fault line 332 is equal to the value the logic 320 intended the value of the fault line 332 to be at the time. Based on the comparison of the value and the intended value, the logic 320 may determine whether the value on the fault line 332 is an error and indicate the error to the controller.

The fault detection circuitry 300 may further include an on/off line 344 coupled to the logic 320. The on/off line 344 may provide values to the logic 320 to turn on and turn off all of the electronic limiters (such as the electronic limiter 306) within the fault detection circuitry 300. In some embodiments, the on/off line 344 may be configured to turn on and turn off the electronic limiters of each of the electronic limiter circuitries (such as the first electronic limiter circuitry 302a, the second electronic limiter circuitry 302b, and/or the third electronic limiter circuitry 302c) individually.

Figure 4:
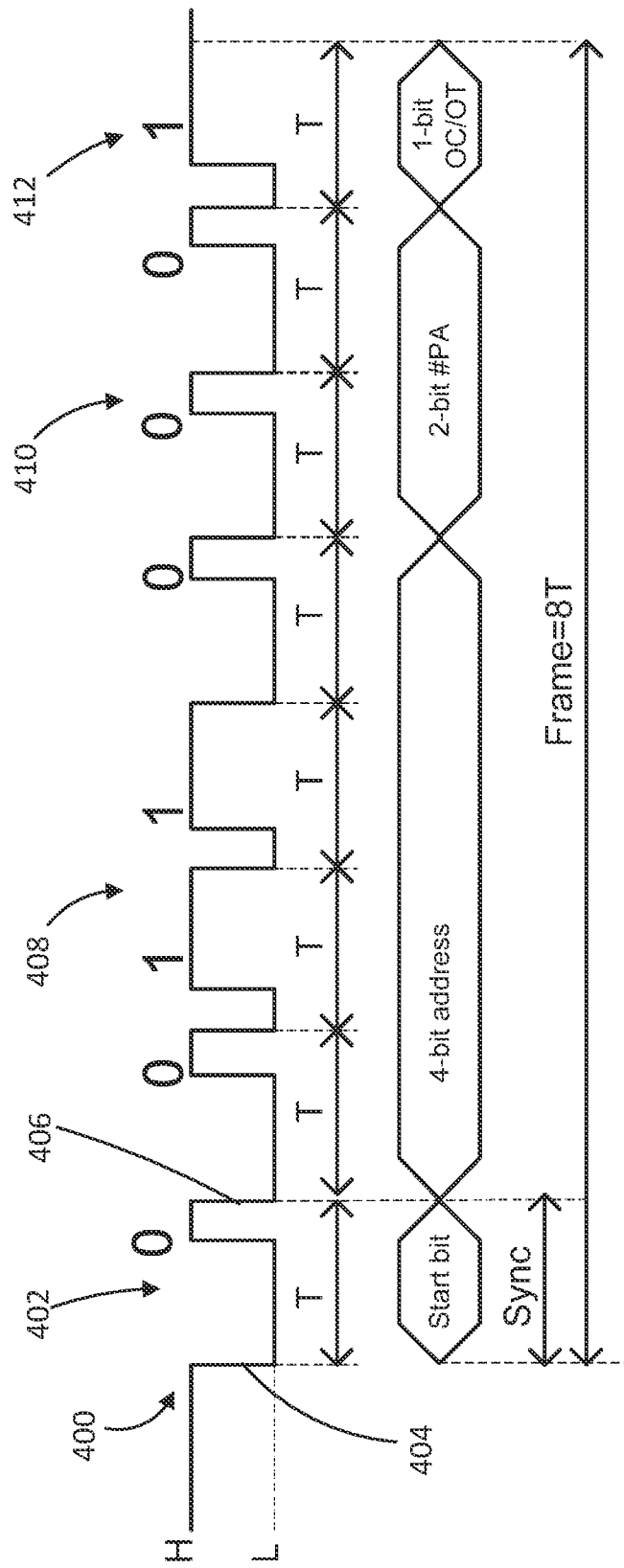
FIG. 4 illustrates another example fault indicator signal, according to various embodiments of the disclosure.

FIG. 4 illustrates another example fault indicator signal 400, according to various embodiments of the disclosure. The fault indicator signal 400 may be propagated on the fault line 332 (FIG. 3) by the logic 320 (FIG. 3). In particular, the fault indicator signal 400 illustrates a portion of a signal propagated on the fault line 332 when a fault condition has been detected by the logic 320. The logic 320 may maintain the value of the fault line 332 at a logic level high when a fault condition has not been detected by the logic 320. The fault indicator signal 400 is to be understood as an example of a configuration for signals propagated on the fault line 332 indicating a fault condition and is not to be interpreted to limiting the embodiment to the exact values (i.e., logic level high or logic level low) depicted by the fault indicator signal 400.

In the illustrated embodiment, the indication of the fault condition in the fault indicator signal 400 may comprise eight frames, where each frame is equal to a predetermined time. The predetermined time may be dependent on the system. Each frame of the indication of the fault condition may initiate with a transition to a logic level low of the frame. In other embodiments, the fault condition may be indicated by more or fewer frames depending on the number of bits in addresses assigned to PAs (such as the addresses being assigned by the logic 320 to the PAs described in FIG. 3) and/or the number of bits of data related to the fault condition to be included.

The indication of the fault condition may initiate with a start bit 402 in the fault indicator signal 400. The start bit 402 may comprise a portion of the fault indicator signal 400 that is to be determined by the controller to have a bit value of 0 based on the value of the fault indicator signal 400 being maintained at a logic level low for at least 75% of a frame. The start bit 402 may occur after the fault indicator signal 400 has been maintained at a logic level high for at least a predetermined number of frames, such as at least 16 frames. The start bit 402 may initiate with the fault indicator signal 400 being pulled to a logic level low at a beginning of the frame corresponding to the start bit 402 and transitioning to a logic level high after at least 75% of the frame has passed. The fault indicator signal 400 may again be pulled to a logic level low at the end of the frame corresponding to the start bit 402.

A first falling edge 404 of the start bit 402 that occurs when the fault indicator signal 400 is pulled to a logic level low at the beginning of the frame may indicate that the indication of the fault condition is beginning to the controller. In some embodiments, the first falling edge 404 may cause an interrupt of the controller. Further, the first falling edge 404 may cause other bus members to be disabled for the duration of the indication of the fault condition. Further, the first falling edge 404 and a second falling edge 406, that occurs when the fault indicator signal 400 is pulled to a logic level low at the end of the frame, may be utilized by the controller to synchronize with the frames of the fault indicator signal 400.

Following the start bit 402, the fault indicator signal 400 may include an external address indication 408. The external address indication 408 may have a duration of four frames, and may indicate an address assigned the PA that was detected to be in a fault condition. Each frame of the external address indication 408 may indicate a bit of the address of the PA. For example, the frames of the external address indication 408 translate to the address of "0110" in the illustrated embodiment. The fault indicator signal 400 may be maintained in a logic level low for at least 75% of a frame to indicate that the frame should be interpreted as a 0 bit, and may be maintained in a logic level low for at most 25% of the frame to indicate that the frame should be interpreted as a 1 bit. In other embodiments, the percentage of the times that the fault indicator signal 400 is maintained in a logic level low to indicate the value of the bit may vary, where the percentage to be interpreted as a 0 bit may be greater than 50% and the percentage to be interpreted as a 1 bit may be less than 50%. In other embodiments, the external address indication 408 may have a duration of more than or fewer than four frames, where the number of frames may be equal to the number of frames in each address of the PAs.

Following the external address indication 408, the fault indicator signal 400 may include an internal address indication 410. The internal address indication 410 may indicate an address assigned to one of the electronic limiters (such as the electronic limiter 306) by the logic 320. The internal address indication 410 may have a duration of two frames, and may indicate an address assigned an electronic limiter corresponding to a PA that was detected to be in a fault condition. Each frame of the internal address indication 410 may indicate a bit of the address of the electronic limiter. For example, the frames of the internal address indication 410 translate to the address of "00" in the illustrated embodiment. The fault indicator signal 400 may be maintained in a logic level low for at least 75% of a frame to indicate that the frame should be interpreted as a 0 bit, and may be maintained in a logic level low for at most 25% of the frame to indicate that the frame should be interpreted as a 1 bit. In other embodiments, the percentage of the times that the fault indicator signal 400 is maintained in a logic level low to indicate the value of the bit may vary, where the percentage to be interpreted as a 0 bit may be greater than 50% and the percentage to be interpreted as a 1 bit may be less than 50%. Based on the address indicated by the external address indication 408 and the internal address indication 410, the indication of the PA may refer to $2^6$, or 64, combinations of electronic limiters and PAs. In other embodiments, the internal address indication 410 may have a duration of more than or fewer than two frames, where the number of frames may be equal to the number of frames in each address of the PAs.

Following the internal address indication 410, the fault indicator signal 400 may include a data bit 412. The data bit 412 may indicate a reason for the fault condition. In some embodiments, the data bit 412 may indicate whether the fault condition is due to over-current or over-temperature. Based on the external address indication 408, the internal address indication 410, and/or the data bit 412, the controller that receives the fault indicator signal 400 may determine how to address the fault condition. For example, the controller may direct communications intended for transmission via the PA in the fault condition to other PAs that are not in fault condition in some embodiments. In instances where the data bit 412 indicates that the reason for the fault condition is over-temperature, the controller may direct communications away from the PA in the fault condition for a period of time to allow the PA to cool. In some embodiments, the controller may further take corrective actions to address the fault condition where the fault condition may be corrected.

Figure 5:
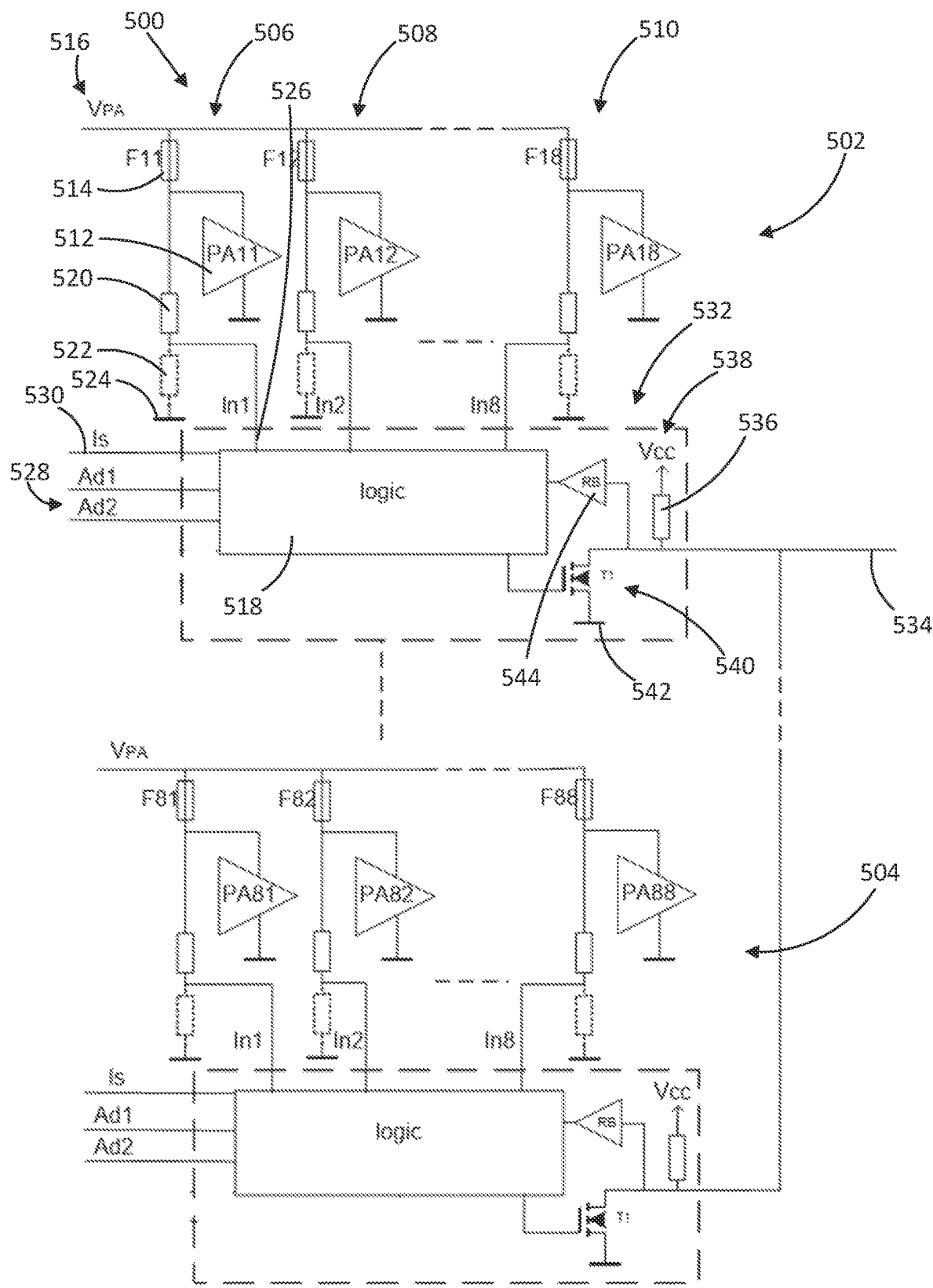
FIG. 5 illustrates an example system with another example fault detection circuitry, according to various embodiments of the disclosure.

FIG. 5 illustrates an example system 500 with another example fault detection circuitry, according to various embodiments of the disclosure. The system 500 may include one or more subsystems where each of the subsystems includes fault detection circuitry. For example, the system 500 shows a first subsystem 502 and a second subsystem 504. In some embodiments, the system 500 may include eight subsystems. Further, the system 500 may comprise a localizer with a one line fault bus. Each of the subsystems may be coupled to the one line bus. For brevity, the first subsystem 502 is described herein. It is to be understood that the other subsystems include one or more of the features of the first subsystem 502.

The first subsystem 502 may include a plurality of channels, where each channel may include a PA. The first subsystem 502 shows a first channel 506, a second channel 508, and a third channel 510 in the illustrated embodiment.

In some embodiments, the first subsystem 502 may include eight channels. For brevity, the first channel 506 is described. It is to be understood that each of the channels may include one or more of the features of the first channel 506.

The first channel 506 may include a PA 512. The PA 512 may be configured to receive a signal and amplify the signal. The first channel 506 may further include a fuse 514 coupled between the PA 512 and a power source 516. The fuse 514 may comprise a physical fuse or an electronic fuse. The fuse 514 may be configured to trip at a predetermined current draw, where the predetermined current draw may be greater than a current draw of the PA 512 during normal operation and/or a current draw of logic 518 coupled to the fuse 514. The fuse 514 may allow current to flow from the power source 516 to the PA 512 to power the PA 512 during normal operation. Further, the fuse 514 may prevent current flow from the power source 516 to the PA 512 when the fuse 514 is tripped, thereby turning off the PA 512.

The first subsystem 502 may further include logic 518. The logic 518 may comprise an integrated circuit, such as a processor. The logic 518 may be coupled to the fuse 514 and the PA 512. The first channel 506 may further include an impedance element 520 coupled between the logic 518, and the fuse 514 and the PA 512. In some embodiments, the first channel 506 may further include a second impedance element 522 coupled between the impedance element 520 and a ground 524 of the system 500.

In embodiments where the first channel 506 does not include the second impedance element 522, the logic 518 may act as a drain and may detect current flowing across the impedance element 520 to determine whether the fuse 514 has tripped. In particular, the logic 518 may detect whether current is entering the logic 518 through pin 526, which is coupled to the impedance element 520. If the logic 518 detects current entering the logic 518, the logic 518 may determine that current is flowing through the fuse 514 and the fuse 514 is operating in a normal condition. If the logic 518 detects that current is not entering the logic 518, the logic 518 may determine that current is not flowing through the fuse 514 and the fuse 514 has tripped. Based on the logic 518 determining that the fuse 514 has tripped, the logic 518 may determine that the PA 512 is inoperable.

In embodiments where the first channel 506 includes the second impedance element 522, the impedance element 520 and the second impedance element 522 may act as a voltage divider with the logic 518 coupled between the impedance element 520 and the second impedance element 522. The logic 518 may detect the voltage between the impedance element 520 and the second impedance element 522 and determine, based on the voltage, whether current is flowing across the fuse 514. In particular, the logic 518 may determine that current is flowing across the fuse 514 when the voltage between the impedance element 520 is a first voltage and may determine that current is not flowing across the fuse 514 when the voltage is a second voltage. In some embodiments, the logic 518 may determine that current is not flowing across the fuse 514 when the voltage is zero volts and may determine that current is flowing across the fuse 514 when the voltage is non-zero. The logic 518 may determine that the fuse 514 is in normal operation and the PA 512 is operational based on determining that current is flowing across the fuse 514. Further, the logic 518 may determine that the fuse 514 tripped and the PA 512 is inoperable based on determining that current is not flowing across the fuse 514.

The first subsystem 502 may include one or more address lines 528 coupled to the logic 518. For example, the address lines 528 include Ad1 and Ad2 in the illustrated embodiment. The address lines 528 may provide addresses to the logic 518 that can be utilized for assigning an address to PAs. For example, the logic 518 may assign an address from the address lines 528 to the PA 512, or to a group of PAs coupled to the fuse 514 when the fuse 514 is coupled to multiple PAs. Multiple different voltage levels may be applied to the address lines 528 to indicate an address to be assigned to one of the PAs. For example, the logic 518 may distinguish between four different threshold levels on each of the address lines 528 to determine numbers for an address to be assigned to the PAs. In some examples, a first threshold level (such as 0 volts) may translate to a bit value of 00, a second threshold level (such as 1.7 volts) may translate to a bit value of 01, a third threshold level (such as 3.4 volts) may translate to a bit value of 10, and a fourth threshold level (such as 5 volts) may translate to a bit value of 11. One of the address lines 528 (such as Ad1) may provide the two least significant bits of the address to be assigned, while the other of the address lines 528 (such as Ad2) may provide the two most significant bits of the address. Accordingly, the address lines 528 may provide a four bit address in the illustrated example, which may provide for 16 addresses to be generated.

The first subsystem 502 may further include a trip value line 530 coupled to the logic 518. The trip value line 530 may be utilized to set a trip current for one or more of the fuses (such as the fuse 514) within the first subsystem 502. The logic 518 may detect a value on the trip value line 530 and determine a current threshold at which one or more of the fuses are to be tripped based on the value. The current threshold may be applied to all the fuses within the first subsystem 502, or to a particular fuse corresponding to an address concurrently applied to the address lines 528.

The first subsystem 502 may further include fault line bus circuitry 532. The fault line bus circuitry 532 may be coupled to the logic 518 and may be utilized by the logic 518 to provide information regarding any PA fault conditions on a fault line 534. The fault line 534 may be coupled to fault line bus circuitry of each of the subsystems, such as the first subsystem 502 and the second subsystem 504 in the illustrated embodiment. The fault line 534 may be a single wire fault line in some embodiments. In other embodiments, the fault line 534 may include more than one wire and/or may implement certain communication standards such as SPI. The fault line 534 may be coupled to a controller that controls the signals provided to the PAs, such as PA 512.

The fault line bus circuitry 532 may include an impedance element 536 coupled between a voltage rail 538 of the system 500 and the fault line 534. The fault line bus circuitry 532 may further include a transistor 540 coupled between a ground 542 of the system 500 and the fault line 534. The logic 518 may be coupled to the transistor 540 and may control activation of the transistor 540 (i.e., whether current is allowed to flow across the transistor 540). When the logic 518 activates the transistor 540, the fault line 534 may be pulled to ground causing the fault line 534 to present a low logic state. When the logic 518 deactivates the transistor 540, the fault line 534 may be pulled to the voltage rail causing the fault line 534 to present a high logic state. The fault line bus circuitry 532 may be configured as open drain to ensure OR logic-function. The logic 518 may cause the transistor 540 to transition between activation and deactivation to cause certain information to be placed on the fault line 534, as described further in relation to FIG. 6.

The fault line bus circuitry 532 may further include a read back device 544. In some embodiments, the read back device 544 may comprise a comparator. The read back device 544 may be coupled between the fault line 534 and the logic 518. The read back device 544 may provide the value of the fault line 534 back to the logic 518. The logic 518 may determine whether the value of the fault line 534 is equal to the value the logic 518 intended the value of the fault line 534 to be at the time. Based on the comparison of the value and the intended value, the logic 518 may determine whether the value on the fault line 534 is an error and indicate the error to the controller.

Figure 6:
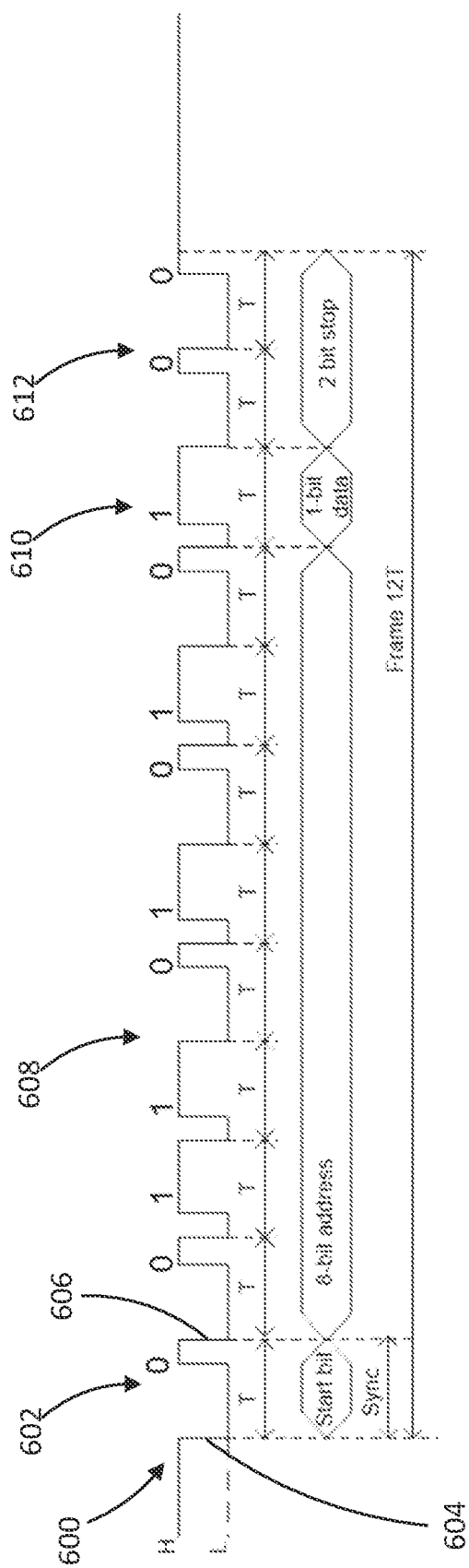
FIG. 6 illustrates another example fault indicator signal, according to various embodiments of the disclosure.

FIG. 6 illustrates another example fault indicator signal 600, according to various embodiments of the disclosure. The fault indicator signal 600 may be propagated on the fault line 534 (FIG. 5) by any of the subsystems. In particular, the fault indicator signal 600 illustrates a portion of a signal propagated on the fault line 534 when a fault condition has been detected by any of the logics (such as logic 518 (FIG. 5)) within the system 500 (FIG. 5). The logic may maintain the value of the fault line 534 at a logic level high when a fault condition has not been detected by the logic. The fault indicator signal 600 is to be understood as an example of a configuration for signals propagated on the fault line 534 indicating a fault condition and is not to be interpreted to limiting the embodiment to the exact values (i.e., logic level high or logic level low) depicted by the fault indicator signal 600.

In the illustrated embodiment, the indication of the fault condition in the fault indicator signal 600 may comprise twelve frames, where each frame is equal to a predetermined time. The predetermined time may be dependent on the system. Each frame of the indication of the fault condition may initiate with a transition to a logic level low of the frame. In other embodiments, the fault condition may be indicated by more or fewer frames depending on the number of bits in addresses assigned to PAs (such as the addresses being assigned by the logic to the PAs described in FIG. 5) and/or the number of bits of data related to the fault condition to be included.

The indication of the fault condition may initiate with a start bit 602 in the fault indicator signal 600. The start bit 602 may comprise a portion of the fault indicator signal 600 that is to be determined by the controller to have a bit value of 0 based on the value of the fault indicator signal 600 being maintained at a logic level low for at least 75% of a frame. The start bit 602 may occur after the fault indicator signal 600 has been maintained at a logic level high for at least a predetermined number of frames, such as at least 16 frames. The start bit 602 may initiate with the fault indicator signal 600 being pulled to a logic level low at a beginning of the frame corresponding to the start bit 602 and transitioning to a logic level high after at least 75% of the frame has passed. The fault indicator signal 600 may again be pulled to a logic level low at the end of the frame corresponding to the start bit 602.

A first falling edge 604 of the start bit 602 that occurs when the fault indicator signal 600 is pulled to a logic level low at the beginning of the frame may indicate that the indication of the fault condition is beginning to the controller. In some embodiments, the first falling edge 604 may cause an interrupt of the controller. Further, the first falling edge 604 may cause other bus members to be disabled for the duration of the indication of the fault condition. Further, the first falling edge 604 and a second falling edge 606, that occurs when the fault indicator signal 600 is pulled to a logic level low at the end of the frame, may be utilized by the controller to synchronize with the frames of the fault indicator signal 600.

Following the start bit 602, the fault indicator signal 600 may include an address indication 608. The address indication 608 may have a duration of eight frames, and may indicate an address assigned to the PA that was detected to be in a fault condition. Each frame of the address indication 608 may indicate a bit of the address of the PA. For example, the frames of the address indication 608 translate to the address of "01101010" in the illustrated embodiment. The fault indicator signal 600 may be maintained in a logic level low for at least 75% of a frame to indicate that the frame should be interpreted as a 0 bit, and may be maintained in a logic level low for at most 25% of the frame to indicate that the frame should be interpreted as a 1 bit. In other embodiments, the percentage of the times that the fault indicator signal 600 is maintained in a logic level low to indicate the value of the bit may vary, where the percentage to be interpreted as a 0 bit may be greater than 50% and the percentage to be interpreted as a 1 bit may be less than 50%. In other embodiments, the address indication 608 may have a duration of more than or fewer than eight frames, where the number of frames may be equal to the number of frames in each address of the PAs.

Following the address indication 608, the fault indicator signal 600 may include a data bit 610. The data bit 610 may indicate a reason for the fault condition. In some embodiments, the data bit 610 may indicate whether the fault condition is due to over-current or over-temperature. Based on the address indication 608 and/or the data bit 610, the controller that receives the fault indicator signal 600 may determine how to address the fault condition. For example, the controller may direct communications intended for transmission via the PA in the fault condition to other PAs that are not in fault condition in some embodiments. In instances where the data bit 610 indicates that the reason for the fault condition is over-temperature, the controller may direct communications away from the PA in the fault condition for a period of time to allow the PA to cool. In some embodiments, the controller may further take corrective actions to address the fault condition where the fault condition may be corrected.

The indication of the fault condition may end with stop bits 612 in the fault indicator signal 600. The stop bits 612 may indicate to the controller that the indication of the fault condition has completed. In the illustrated embodiment, the stop bits 612 may comprise two frames. The values represented by the frames corresponding to the stop bits 612 may be set to a predetermined value to indicate the completion of the indication of the fault condition.

Figure 7:
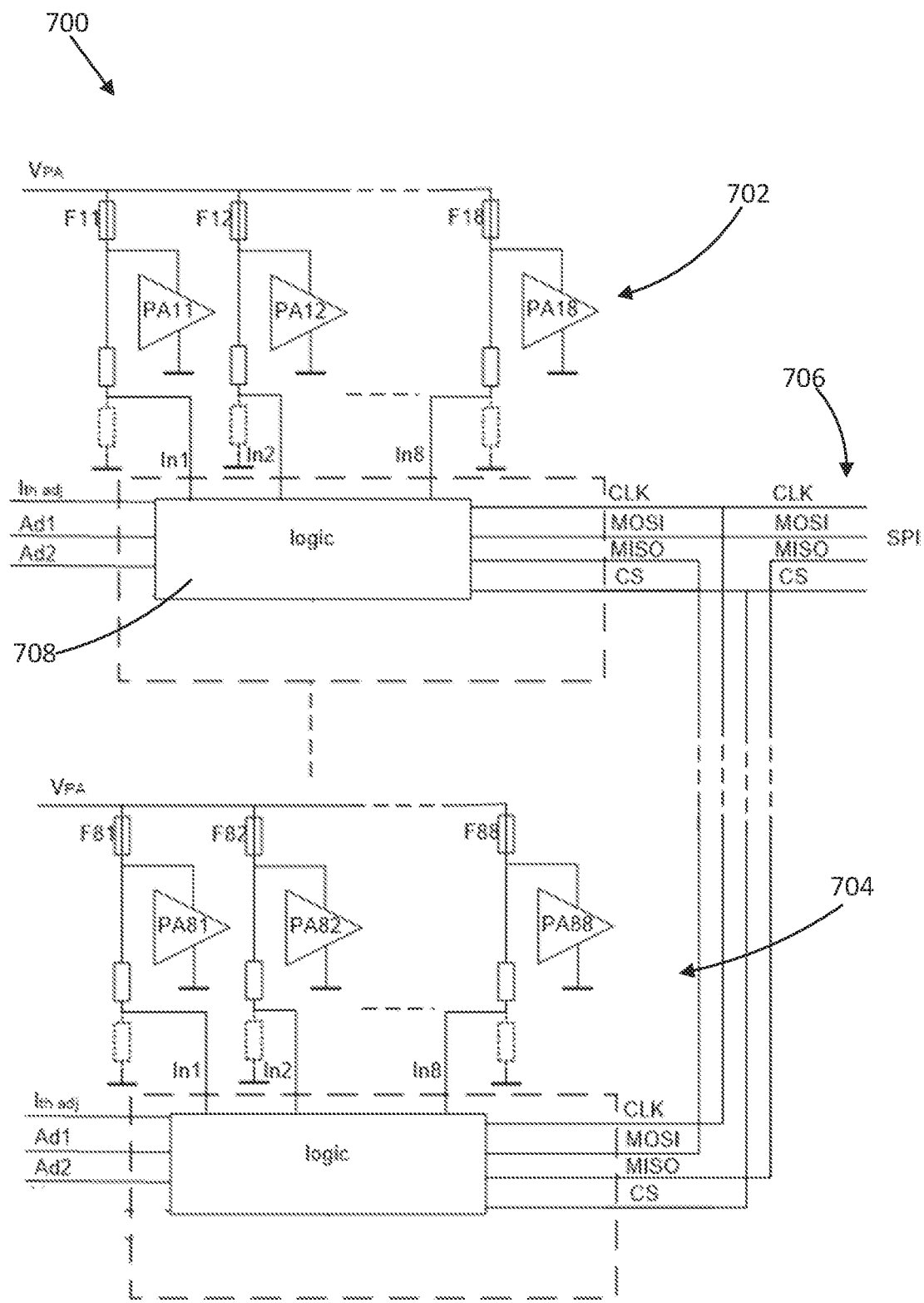
FIG. 7 illustrates an example system with another example fault detection circuitry, according to various embodiments of the disclosure.

FIG. 7 illustrates an example system 700 with another example fault detection circuitry, according to various embodiments of the disclosure. The system 700 may include one or more of the features of the system 500 (FIG. 5). Further, the system 700 may include one or more subsystems, include first subsystem 702 and second subsystem 704. The subsystems of the system 700 may include the features of the subsystems of the system 500 (such as the first subsystem 502 (FIG. 5)), with the exception of the fault line bus circuitry (such as the fault line bus circuitry 532 (FIG. 5)). In particular, the subsystems of the system 700 may omit the fault line bus circuitry.

The system 700 may include an SPI bus 706. The SPI bus 706 may be in place of a fault line, such as the fault line 534 (FIG. 5). The SPI bus 706 may be coupled to each of the subsystems of the system 700, where each of the subsystems may utilize the SPI bus 706 to transmit information regarding PAs that are in a fault condition to a controller for the PAs. In particular, logic of each of the subsystems may be coupled to the SPI bus 706 and transmit information on the SPI bus 706. For example, logic 708 may be coupled to the SPI bus 706 and may transmit information regarding PAs of the first subsystem 702 that are in a fault condition. The information transmitted on the SPI bus 706 by each of the subsystems may be formatted in accordance with SPI standards.

Figure 8:
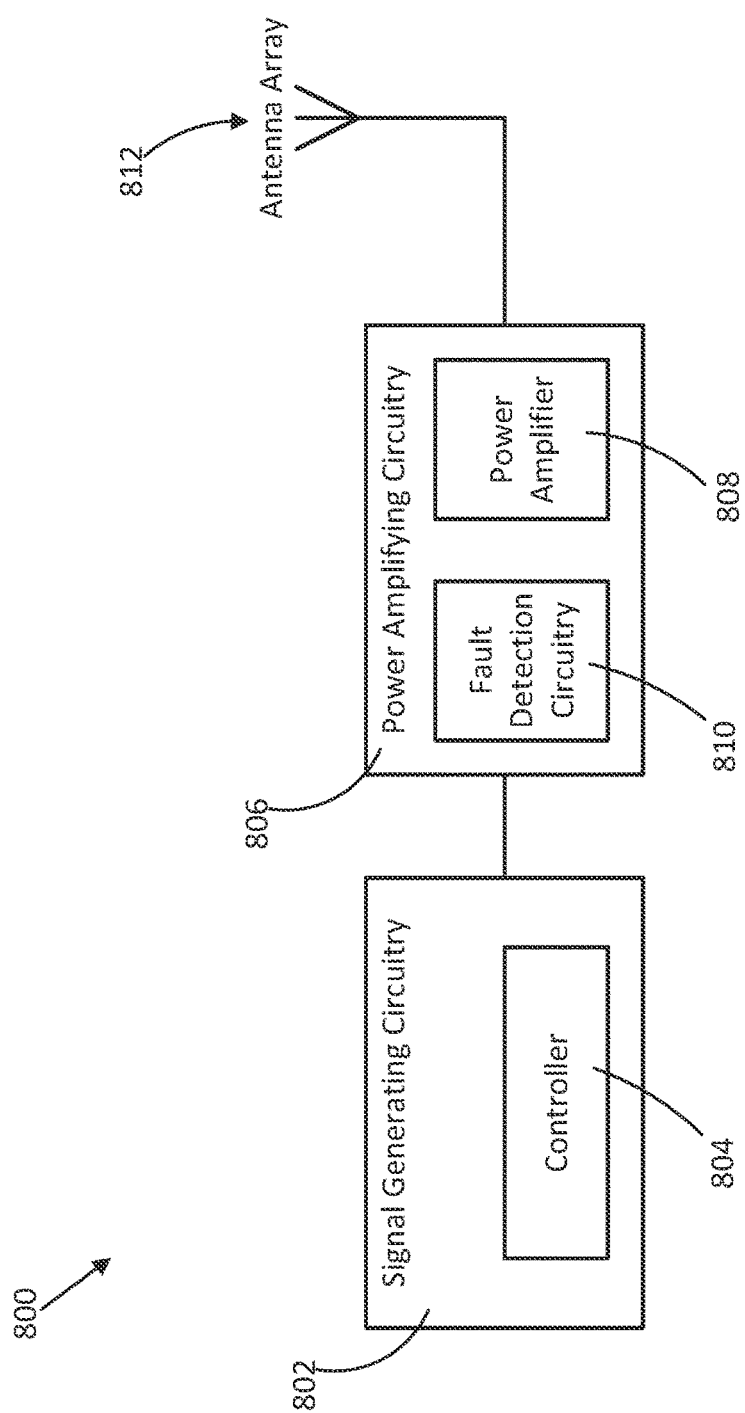
FIG. 8 illustrates a portion of an example communication system, according to various embodiments of the disclosure.

FIG. 8 illustrates a portion of an example communication system 800, according to various embodiments of the disclosure. The communication system 800 may implement any of the fault detection circuitry disclosed herein, including the fault detection circuitry 100 (FIG. 1), the fault detection circuitry 300 (FIG. 3), the system 500 (FIG. 5), and/or the system 700 (FIG. 7). In some embodiments, the communication system 800 may comprise an entity (such as a base station) of a cellular mobile communications system, such as a 5G mobile communication system, a 4G mobile communication system, a 3G mobile communication system, and/or a 2G mobile communication system. It should be understood that the communication system 800 is illustrated in a simplified format and the elements of the communication system 800 illustrated may include elements included in entities of mobile communication systems.

The communication system 800 may include signal generating circuitry 802. The signal generating circuitry 802 may comprise circuitry to generate communications to be transmitted by the communication system 800. The signal generating circuitry 802 may include a controller 804. The controller 804 may control transmission of the communications. For example, the controller 804 may control which means of transmission (such as which antenna) is utilized to transmit the communication. Further, the controller 804 may control which PA or PAs are utilized for amplifying the communications produced by the signal generating circuitry 802.

The communication system 800 may further include power amplifying circuitry 806. The power amplifying circuitry 806 may be coupled to the signal generating circuitry 802 and may be configured to amplify communications received from the signal generating circuitry 802. The power amplifying circuitry 806 may include one or more PAs 808 that amplify the communication from the signal generating circuitry 802. The power amplifying circuitry 806 may further include fault detection circuitry 810. The fault detection circuitry 810 may comprise the fault detection circuitry 100, the fault detection circuitry 300, or some combination thereof. In some embodiments, the fault detection circuitry 810 and the PAs 808 comprise the system 500, the system 700, or some combination thereof. The fault detection circuitry 810 may detect faults of the PAs 808 and transmit information regarding the faults of the PAs 808 to the controller 804. Based on the information regarding the faults, the controller 804 may control which means for transmission and/or which PAs 808 are to be utilized for transmission of communications to avoid any of the PAs 808 that are in a fault condition.

The communication system 800 may further include an antenna array 812. The antenna array 812 may include one or more antennas that may be utilized for wirelessly transmitting the communications from the signal generating circuitry 802. Each of the antennas within the antenna array 812 may be coupled to one or more of the PAs 808 and may receive the amplified communications from the PAs 808 for transmission. In other embodiments, the communication system 800 may include other transmission means, such as wires, to wirelessly or wiredly communicate the communications to another device or system.

While the controller 804 is illustrated within the signal generating circuitry 802 and the fault detection circuitry 810 is illustrated within the power amplifying circuitry 806 in the illustrated embodiment, it is to be understood that the location of the elements may differ in other embodiments. In particular, the controller 804 may be included in the signal generating circuitry 802 or the power amplifying circuitry 806 in other embodiments. Further, the fault detection circuitry 810 may be included in the signal generating circuitry 802 or the power amplifying circuitry 806 in other embodiments.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure. Note that the activities discussed above with reference to the FIGURES are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data. Certain embodiments can relate to multi-DSP, multi-ASIC, or multi-SoC signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include, for example, pulmonary monitors, accelerometers, heart rate monitors, or pacemakers, along with peripherals therefor. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion, rendering, and display products in battery monitoring, control systems, reporting controls, maintenance activities, and others. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Example Implementations

The following examples are provided by way of illustration.

Herein disclosed as example 1 is a fault detector to detect faults of one or more power amplifiers, comprising an electronic limiter coupled to at least one power amplifier of the one or more power amplifiers and to a power source of the at least one power amplifier, and logic coupled to the electronic limiter, the logic to determine an amount of current flow across the electronic limiter, and control operation of the electronic limiter based on the determined amount of current flow.

There is further disclosed as example 2 a fault detector of example 1 or some other example herein, further comprising an operational amplifier coupled to an input of the electronic limiter and an output of the electronic limiter, wherein the operational amplifier is to determine a voltage difference between the input of the electronic limiter and the output of the electronic limiter, and wherein the logic is to determine the amount of current flow based on the determined voltage difference.

There is further disclosed as example 3 a fault detector of example 1 or some other example herein, wherein the logic is further to compare the determined amount of current flow to a current threshold, and cause the electronic limiter to limit or prevent current flow across the electronic limiter in response to the determined amount of current flow exceeding the current threshold.

There is further disclosed as example 4 a fault detector of example 1 or some other example herein, wherein the logic is further to assign one or more addresses to the one or more power amplifiers, and determine an address, of the one or more addresses, assigned to the at least one power amplifier based on the logic causing a change in the operation of the electronic limiter.

There is further disclosed as example 5 a fault detector of example 4 or some other example herein, wherein causing the change of the operation of the electronic limiter includes causing the electronic limiter to limit or prevent current flow across the electronic limiter.

There is further disclosed as example 6 a fault detector of example 4 or some other example herein, further comprising fault line bus circuitry coupled to the logic, wherein the logic is further to cause the fault line bus circuitry to transmit the determined address on a fault line of the fault detector.

There is further disclosed as example 7 a fault detector of example 6 or some other example herein, wherein the fault line bus circuitry includes a read back device coupled between the logic and the fault line, wherein the read back device is to provide values from the fault line to the logic, and wherein the logic is to verify proper transmission of the determined address based on the values provided by the read back device.

There is further disclosed as example 8 a fault detector of example 6 or some other example herein, wherein the fault line comprises a single wire fault line, wherein the fault line bus circuitry includes a transistor coupled to the logic and the single wire fault line, and wherein the logic is to control activation of the transistor to output bit values of the address on the single wire fault line.

There is further disclosed as example 9 a fault detector of example 1 or some other example herein, wherein the electronic limiter is a first electronic limiter, wherein the at least one power amplifier is a first portion of the one or more power amplifiers, wherein the fault detector further comprises a second electronic limiter coupled to a second portion of the one or more power amplifiers and a power source of the second portion, wherein the logic is coupled to the second electronic limiter, and wherein the logic is further to cause the first electronic limiter to prevent current flow across the first electronic limiter based on the determined amount of current flow across the first electronic limiter while the logic causes the second electronic limiter to allow current flow across the second electronic limiter.

There is further disclosed as example 10 a method for detecting faults of one or more power amplifiers, comprising determining, by logic, an amount of current flow across a current limiter coupled to a portion of the one or more power amplifiers and a power source for the portion of the one or more power amplifiers, determining, by the logic, whether the determined amount of current flow exceeds a current threshold, and controlling, by the logic, activation of the current limiter based on the determination whether the determined amount of current flow exceeds the current threshold.

There is further disclosed as example 11 a method of example 10 or some other example herein, wherein controlling the activation of the current limiter includes causing, by the logic, the current limiter to prevent or limit current flow across the current limiter in response to the determined amount of current flow exceeding the current threshold.

There is further disclosed as example 12 a method of example 10 or some other example herein, further comprising determining, by the logic, an address corresponding to the portion of the one or more amplifiers in response to determining that the determined amount of current flow exceeds the current threshold, and causing, by the logic, a fault indicator signal that includes the address to be transmitted via a fault line.

There is further disclosed as example 13 a method of example 12 or some other example herein, wherein causing the fault indicator signal to be transmitted via the fault line includes causing a transistor coupled to the fault line to be activated and deactivated to produce the fault indicator signal.

There is further disclosed as example 14 a method of example 13 or some other example herein, wherein the logic is to cause the fault line to present a logic level low for greater than 50% of a clock cycle to indicate that a bit corresponding to the clock cycle is to be interpreted as a 0 bit and the logic is to cause the fault line to present a logic level low for less than 50% of the clock cycle to indicate that the bit corresponding to the clock cycle is to be interpreted as a 1 bit.

There is further disclosed as example 15 a method of example 12 or some other example herein, wherein the logic determines that the portion of the one or more amplifiers is in a fault condition based on the determined amount of current flow exceeding the current threshold, and wherein the fault indicator signal further includes a data bit that indicates a reason for the fault condition.

There is further disclosed as example 16 a method of example 12 or some other example herein, further comprising determining, by the logic, whether a value of the fault line, fed back to the logic from a read back device coupled to the fault line, is equal to an intended value for the fault line.

There is further disclosed as example 17 a method of example 10 or some other example herein, wherein determining the amount of the current flow across the current limiter includes receiving an indication of a voltage difference between an input of the current limiter and an output of the current limiter from an operational amplifier coupled to the input of current limiter and the output of the current limiter, and determining the amount of the current flow across the current limiter based on the indication of the voltage difference.

There is further disclosed as example 18 a communication system, comprising an antenna array, signal generating circuitry to generate communications for transmission via the antenna array, and power amplifying circuitry coupled between the antenna array and the signal generating circuitry, the power amplifying circuitry including one or more power amplifiers to receive the communications from the signal generating circuitry and amplify the communications for transmission via the antenna array, and fault detection circuitry coupled to the one or more power amplifiers, the fault detection circuitry to determine whether any of the one or more power amplifiers is in fault condition, and prevent or limit current flow from a power source to any of the one or more power amplifiers determined to be in the fault condition.

There is further disclosed as example 19 a communication system of example 18 or some other example herein, wherein the fault detection circuitry is further to determine one or more addresses corresponding to the one or more power amplifiers determined to be in the fault condition, and indicate the one or more addresses to the signal generating circuitry.

There is further disclosed as example 20 a communication system of example 19 or some other example herein, wherein the signal generating circuitry is further to direct the communications away from the one or more power amplifiers determined to be in the fault condition in response to receipt of the indication of the one or more addresses from the fault detection circuitry.

There is further disclosed an apparatus, comprising means to perform the method of a number of the above examples.

There is further disclosed an apparatus, wherein the means comprise a system-on-a-chip.

There are also disclosed one or more tangible, non-transitory computer-readable mediums having stored thereon instructions to instruct a programmable device to perform the method or realize at least part of the apparatus of a number of the above examples.

There are also disclosed one or more tangible, non-transitory computer-readable mediums, wherein the instructions include hardware description language directives.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SoC) central processing unit (CPU) package. An SoC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. Any module, function, or block element of an ASIC or SoC can be provided, where appropriate, in a reusable "black box" intellectual property (IP) block, which can be distributed separately without disclosing the logical details of the IP block. In various other embodiments, the digital signal processing functionalities may be implemented in one or more silicon cores in application-specific integrated circuits (ASICs), field-programmable gate arrays (FPGAs), and other semiconductor chips.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, the capacitors, buffers, graphics elements, interconnect boards, clocks, DDRs, camera sensors, converters, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

What is claimed is:

1. An electronic limiter, comprising:
a first transistor having an input coupled between a power source and an output coupled to a circuit component;
an operational amplifier having a first input coupled to the input of the first transistor, a second input coupled to the output of the first transistor;
logic circuitry coupled to an output of the operational amplifier; and
a driver coupled between the logic circuitry and a gate of the first transistor.

2. The electronic limiter of claim 1, wherein the logic circuitry determines an amount of current flowing through the first transistor based on the output of the operational amplifier.

3. The electronic limiter of claim 2, wherein the logic circuitry compares the amount of current to a current threshold.

4. The electronic limiter of claim 1, wherein the logic circuitry controls a voltage level of an output of the driver.

5. The electronic limiter of claim 1, wherein:
the logic circuitry comprises one or more address lines;
the logic circuitry is to receive values on the one or more address lines; and
the values correspond to different addresses of circuit components to which the logic circuitry is associated.

6. The electronic limiter of claim 1, further comprising:
fault line bus circuitry coupled to the logic circuitry and a controller for circuit components to which the logic circuitry is associated.

7. The electronic limiter of claim 1, further comprising:
a fault line;
an impedance element coupled between a voltage rail and the fault line; and
a second transistor coupled between ground and the fault line.

8. The electronic limiter of claim 7, wherein the logic circuitry is coupled to a gate of the second transistor.

9. The electronic limiter of claim 7, wherein:
the second transistor, when activated, pulls the fault line to a low logic state; and
the second transistor, when activated, pulls the fault line to a high logic state.

10. The electronic limiter of claim 1, further comprising:
a fault line; and
a comparator having an input coupled to the fault line and an output coupled to the logic circuitry.

* * * * *